United States Patent [19]

Mao et al.

[11] Patent Number: 4,902,642
[45] Date of Patent: Feb. 20, 1990

[54] EPITAXIAL PROCESS FOR SILICON ON INSULATOR STRUCTURE

[75] Inventors: Bor-Yen Mao, Richardson; Richard L. Yeakley, Dallas, both of Tex.

[73] Assignee: Texas Instruments, Incorporated, Dallas, Tex.

[21] Appl. No.: 238,974

[22] Filed: Aug. 24, 1988

Related U.S. Application Data

[63] Continuation of Ser. No. 82,898, Aug. 7, 1987, abandoned.

[51] Int. Cl.[4] .................... H01L 21/20; H01L 21/324
[52] U.S. Cl. ............................... 437/83; 148/DIG. 71; 148/DIG. 152; 148/DIG. 154; 156/603; 437/26; 437/62; 437/106; 437/108; 437/247; 437/939; 437/973; 437/82
[58] Field of Search ............... 148/DIG. 29, 71, 90, 148/93, 97, 134, 150, 152, 154, 117, 118; 156/603, 611–615; 437/26, 62, 83, 101, 106, 173, 108, 109, 973, 976, 939, 174, 19, 247, 82; 427/54.1, 53.1

[56] References Cited

U.S. PATENT DOCUMENTS

| | | | |
|---|---|---|---|
| 4,046,618 | 9/1977 | Chaudhari et al. | 156/603 |
| 4,357,179 | 11/1982 | Adams et al. | 427/53.1 |
| 4,371,421 | 2/1983 | Fan et al. | 148/DIG. 152 |
| 4,448,632 | 5/1984 | Alasaka | 156/603 |
| 4,487,635 | 12/1984 | Kugimiya et al. | 437/173 |
| 4,498,226 | 2/1985 | Inoue et al. | 437/108 |
| 4,498,951 | 2/1985 | Tamura et al. | 156/612 |
| 4,565,584 | 1/1986 | Tamura et al. | 437/973 |
| 4,565,599 | 1/1986 | Geis et al. | 148/DIG. 152 |
| 4,579,609 | 4/1986 | Reif et al. | 437/101 |
| 4,584,025 | 4/1986 | Takaoka et al. | 437/173 |
| 4,596,604 | 6/1986 | Akiyama et al. | 437/939 |
| 4,604,159 | 8/1986 | Kobayashi et al. | 437/84 |
| 4,692,994 | 9/1987 | Moniwa et al. | 437/83 |

FOREIGN PATENT DOCUMENTS 0152285 8/1984 Japan ................... 156/603

OTHER PUBLICATIONS

Ota, Thin Solid Films, vol. 106, 1983, pp. 111 and 112.
Kamins et al., "Structure and Stability of Low Pressure Chemically Vapor-Deposited Silicon Films", J. Electrochem Soc., vol. 125, No. 6, Jun. 1978, pp. 927–932.
Sze, "VLSI Technology", McGraw-Hill Book Co., New York, N.Y., 1983, pp. 99–103.

*Primary Examiner*—Olik Chaudhuri
*Assistant Examiner*—William Bunch
*Attorney, Agent, or Firm*—Stanton C. Braden; Rodney M. Anderson; Melvin Sharp

[57] ABSTRACT

The present invention provides products and methods of forming an epitaxial silicon layer on an implanted buried insulator silicon on insulator structure (10). A silicon film (16) is pre-treated to remove residual oxide and surface damage layers, but in such a way as to not damage the silicon film (16) or insulating layer (14) below the silicon film (16). A layer of amorphous silicon (18) is formed on the silicon film (16) in processes to avoid formation of polycrystalline silicon, and also to avoid damage to the silicon film (16). The layer of amorphous silicon (18) is annealed to form an epitaxial layer of single crystalline silicon (20).

14 Claims, 1 Drawing Sheet

EPITAXIAL PROCESS FOR SILICON ON INSULATOR STRUCTURE

This invention was made with Government support under contract number N00014-84C-2339, awarded by the Naval Research Laboratory.

This application is a continuation of application Ser. No. 07/082,898, filed Aug. 7, 1987 now abandoned.

TECHNICAL FIELD

This invention relates to methods and products in the manufacture of semiconductor devices, and more particularly to products formed by methods of forming an epitaxial silicon layer on an implanted buried insulator silicon on insulator structure.

BACKGROUND OF THE INVENTION

In the design of semiconductor devices, it has been found advantageous in certain circumstances to provide a single crystal silicon layer of a predetermined thickness on a layer of an insulating material. Frequently, the layer of insulating material is itself formed on a silicon base layer or structure.

One method which has been proposed for forming such silicon on insulator devices comprises implanting oxygen into the surface of a silicon structure, and then subjecting the structure to an annealing step, thus forming a relatively thin layer of silicon on an insulating oxide layer which itself is on the silicon structure. Devices formed by this method are termed implanted buried insulator silicon on insulator structures. The silicon film formed on the oxide layer typically ranges in thickness from 800 to 2500 angstroms thick. These silicon film thicknesses, however, are insufficient to form many of the semiconductor devices desired to be formed on the insulating oxide layer.

Accordingly, it has been proposed to form a thicker single crystal or epitaxial silicon layer on the silicon film. However, application of conventional methods of forming an epitaxial silicon layer on an existing single crystalline silicon surface have proven unsatisfactory in the case of the silicon films of silicon on insulator structures. The conventional methods of forming an epitaxial silicon layer on an existing single crystalline silicon surface typically comprise a two-step process. The first step is a pre-treatment to remove residual silicon dioxide and/or a surface damage layer from the single crystalline silicon surface. The second step is a high temperature epitaxial silicon deposition step.

Several reasons lead to the unsuitability of these conventional epitaxial deposition processes to the silicon on insulator structure.

One reason is that the conventional pretreatment comprises a high temperature (i.e., at approximately 900° C. to 1200° C.) gas treatment with gasses comprising HCl or $H_2$. It has been found that these pre-treatments can damage the surface of the silicon film, creating surface pits or, in other cases, entirely removing portions of the silicon film. In such cases, attempts to form an epitaxial silicon layer on the silicon film will result in an unsatisfactory silicon layer having pits or other irregularities. In fact, it has been found that epitaxial formation of a silicon layer will not occur at all in those regions where the silicon film has been entirely removed by the pretreatment.

It has also been found that the epitaxial deposition process itself, apparently by the combination of the high temperatures involved and the presence of $H_2$ or HCl gases in the process, as well as other factors, tends to damage the silicon film and result in a formation of an unsatisfactorily irregular silicon layer on the silicon film.

Thus, it is desired to provide a method of forming an epitaxial silicon layer of a uniform or relatively uniform nature on the silicon film of a silicon on insulator device.

SUMMARY OF THE INVENTION

The present invention comprises methods, and products formed by such methods, of forming an epitaxial layer of silicon on a silicon film of a silicon on insulator device. In the present invention, the silicon on insulator device is first treated in a particular manner to remove silicon dioxide or other surface layers from the silicon film. Next, a layer of amorphous silicon is formed on the silicon film. Finally, the layer of amorphous silicon is annealed at elevated temperatures to form an epitaxial layer of silicon.

The treatment to remove silicon dioxide and other surface layers from the silicon film may comprise a wet etch (such as with hydrofluoric acid), treating the silicon film by a heat treatment at relatively reduced temperature, and/or exposing the silicon layer to a high vacuum environment.

The layer of amorphous silicon may be formed on the silicon film by methods known in the art including low pressure chemical vapor deposition, molecular beam epitaxy methods, or other methods.

The present invention provides the advantage of a method of forming an epitaxial layer of silicon on a silicon film of a silicon on insulator structure. Moreover, the epitaxial layer of silicon is advantageously formed relatively free of surface defects.

The present invention provides the further advantage of a pre-treatment of a silicon film on a silicon on insulator device which removes residual $SiO_2$ and surface layer defects but which does not disadvantageously damage the silicon film.

The present invention provides the technical advantage of a product formed by a method of forming a single crystalline silicon layer on a silicon on insulator structure, without damaging the silicon film or the insulating oxide layer of the silicon on insulator structure.

The present invention further advantageously avoids problems encountered when conventional epitaxial formation methods are used to form a single crystalline layer of silicon on a silicon on insulator structure.

BRIEF DESCRIPTION OF THE DRAWINGS

For a more complete understanding of the invention and the advantages thereof, reference is now made to the following description, taken in conjunction with the accompanying drawings in which.

DETAILED DESCRIPTION OF THE DRAWING

The present invention comprises methods, and products formed by such methods, of forming an epitaxial silicon layer on a silicon film of an implanted buried insulator silicon on insulator structure. The silicon on insulator structure comprises a silicon base layer, an oxide insulating layer on the silicon base layer, and a silicon film on the oxide insulating layer.

In overview, the methods of the present invention comprises first treating the silicon film to remove oxide substances and other surface defects from the silicon film. This treatment step can, in some embodiments, be incorporated into the next step. Next, a layer of amorphous silicon is formed on the silicon film. Finally, the layer of amorphous silicon is annealed to form an epitaxial silicon layer on structure.

Both the treatment of the silicon film prior to formation of the layer of amorphous silicon and the formation of the amorphous layer are accomplished by methods designed to avoid or reduce damage to the silicon film. Avoiding or reducing damage to the silicon film, according to embodiments of the present invention, enhances formation of an improved epitaxial silicon layer on the structure.

Figure 1:
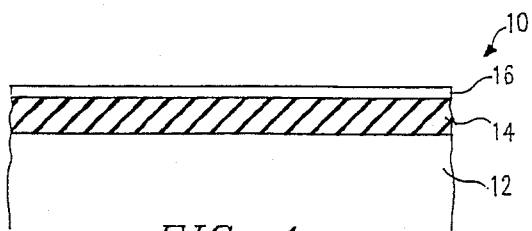
FIG. 1 shows a cross sectional side view of a typical implanted buried insulator silicon on insulator structure.

FIG. 1 shows a cross sectional side view of a typical implanted buried insulator silicon on insulator structure 10. Structure 10 comprises a silicon structure 12 which typically may comprise single crystalline silicon. Formed on the silicon structure 12 is an insulating layer of silicon dioxide 14. Formed, as shown in FIG. 1, on the surface of the layer of silicon dioxide 14, is a silicon film 16. Silicon film 16 comprises single crystalline silicon. The implanted buried insulator silicon on insulator device 10 is typically prepared by implanting oxygen into the surface of a silicon structure such as structure 12. The oxygen implant forms a layer of silicon dioxide such as layer 14. A thermal annealing step follows, typically at about 1275° C., during which the oxygen is driven from the top layer of the surface 14, and a silicon film, such as silicon film 16, of single crystalline silicon is formed on the layer of silicon dioxide. The insulating layer can alternatively be formed by implantation of other elements or substances, such as nitrogen.

The layer of insulating silicon dioxide typically ranges in thickness from approximately 2000 to 5000 angstroms. The silicon film, such as 16, typically ranges in thickness from approximately 800 to 2500 angstroms. However, the thickness of the silicon film is typically insufficient for formation of various desired semiconductor devices in the silicon film. Accordingly, after formation of the implanted buried oxide layer, such as layer 14, it is desirable to form an epitaxial layer of silicon of increased thickness on the silicon film 16.

However, conventional epitaxial processes are not well suited to form an epitaxial silicon layer on the silicon film 16. Both the pre-treatment step and the actual deposition step of conventional epitaxial processes damage silicon films such as that on the silicon on insulator structure to such a degree that an unacceptable epitaxial layer is formed by these processes. In conventional epitaxial deposition processes, a pre-treatment of the silicon surface is necessary to avoid forming polycrystalline silicon rather than single crystalline silicon during the deposition process. The pre-treatments typically comprise exposing the silicon surface to elevated temperatures, approximately 900° to 1200° C., in the presence of HCl or $H_2$ gases. Exposure of the silicon film to either of these gases at elevated temperatures, typically creates surface pits, removes portions of the silicon film, or even etches through the silicon film and through the underlying insulator layer. This damage to the silicon film results in an unacceptable single crystalline structure being formed over the silicon film, particularly since in those regions where the silicon film has been removed, no epitaxial silicon growth will occur at all.

Conventional epitaxial silicon deposition processes are also inapplicable to silicon films such as those of the present device. This is due in large part to the fact that conventional epitaxial silicon deposition process are also carried out at elevated temperatures, in the presence of either $SiH_4$ or $SiH_2Cl_2$ with $H_2$ typically as a carrier gas. The presence of these gases at elevated temperatures will damage the silicon film just as the pre-treatment step in the previous paragraph does.

Figure 2:
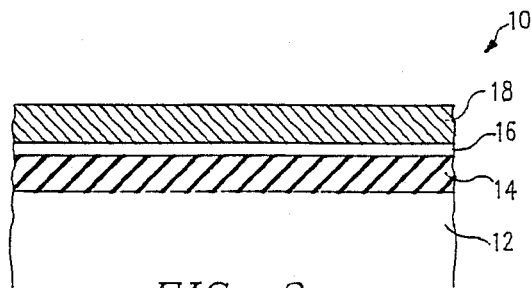
FIG. 2 shows a cross sectional side view of the structure of FIG. 1 on which has been formed a layer of amorphous silicon according to an embodiment of the present invention.

The present invention avoids the problems arising from the use of conventional epitaxial techniques. FIG. 2 shows a cross sectional side view of the silicon on insulator device of FIG. 1, illustrating an embodiment of the present invention. FIG. 2 shows an embodiment of the present invention in which both a pre-treatment of the silicon film and the formation of a layer of amorphous silicon on the silicon film have already been carried out.

The pre-treatment step is intended to remove native oxide and surface damage from the silicon film 16. One source of this surface damage is in the annealing step of the fabrication of the silicon on insulator structure 10 as shown in FIG. 1. However, the pre-treatment step of the present invention is also designed to remove the native oxide and surface damage without disadvantageously damaging the silicon film 16, or oxide layer 14. Accordingly, it has been found that this pre-treatment should comprise methods designed to meet these objectives.

One method found to be effective is a wet etch of the silicon film 16 with a dilute (approximately 10% by volume) HF wet etch for about one minute. Another method found effective is a low temperature bake at temperatures below 750° C. More preferably, the bake is at temperatures below 700° C. Another method found useful is to subject the silicon film 16 to a high vacuum environment at less than approximately $10^{-5}$ to $10^{-6}$ torr, and more preferably, from $10^{-6}$ to $10^{-9}$ torr. Moreover, it has been found that a combination of a bake and low pressure environment can be applied. At a reduced pressure environment, a higher temperature can be used. One reason for this is that a large part of the damage to the silicon film 16 occurs from an attack by $Cl_2$ or $H_2$ and at reduced pressures, the presence of these gases can be restricted.

Further advantages can be realized by an in situ treatment of the silicon on insulator device 10, at relatively more elevated temperatures and low pressures, in the chamber in which the layer of amorphous silicon is to be added to the structure 10.

The pretreatment step is necessary in many instances to remove native oxide and surface defects from the silicon film. Excessive amounts of oxide remaining in the silicon film during the formation of the layer of amorphous silicon on the silicon film, will adversely affect the potential of annealing the layer of amorphous silicon into an epitaxial layer in the annealing step. So, also, certain surface defects of the silicon film adversely affect the potential of forming an acceptable epitaxial silicon layer on the silicon film.

FIG. 2 shows an embodiment of the present invention wherein a layer of amorphous silicon 18 has been formed on the silicon film 16. The layer of amorphous silicon 18, according to the present invention, is formed by any number of available deposition processes, but at reduced temperatures, below approximately 700° C., and more preferably below 600° C., to reduce the likelihood of undesirable damage occurring to the silicon film 16 during the deposition techniques. Another method is a molecular beam epitaxy process. Additionally, other methods can be used. The layer of amorphous silicon can be formed to whatever thickness is desired for the semiconductor devices to be formed on the resulting silicon layer. Typical depths for the layer of amorphous silicon are from 2000 angstroms or less up to 25000 angstroms or more, depending on the semiconductor devices to be fabricated on or in the silicon layer or other considerations. As noted above, the pretreatment step can be conducted in the same chamber in which formation of the layer of amorphous silicon occurs.

It is important during the formation of the layer of amorphous silicon on the silicon film, that amorphous silicon be formed rather than polysilicon. This is because polysilicon, if formed on the silicon film, cannot be annealed to form single crystal silicon as can amorphous silicon. Typically, during silicon deposition processes at temperatures above 700° C. or 750° C., polysilicon is formed rather than amorphous silicon. Accordingly, it is usually preferred, in the practice of the present invention, that the formation of the layer of amorphous silicon occur at temperatures below approximately 700° C. or less, preferably 750° C., to ensure that amorphous silicon as compared to polysilicon, is formed. An example of a low pressure chemical vapor deposition process which can be used, is one occurring at 600° C. and at below 300 millitorrs.

Figure 3:
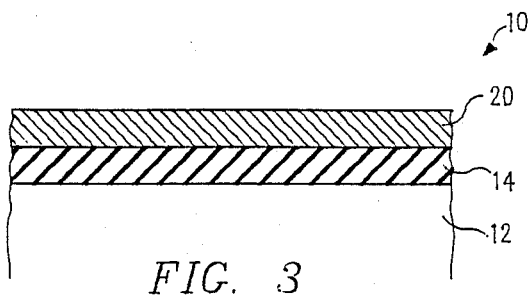
FIG. 3 shows a cross sectional side view of the structure of FIG. 2 after the layer of amorphous silicon has been annealed according to an embodiment of the present invention.

FIG. 3 shows a cross sectional sideview of the silicon on insulator device of FIG. 2, wherein an annealing step has been conducted during which the amorphous layer 18 is changed in conjunction with the single crystal silicon film 16 to form epitaxially a single crystal silicon layer 20. The annealing step is not atypical of conventional silicon annealing processes. The annealing is typically conducted at elevated temperatures at approximately 1200° C. to approximately 1275° C. or more in the presence of gases, typically $N_2$ with a low $O_2$ flow.

The present invention is illustrated by the following example.

EXAMPLE #1

A silicon on insulator structure was prepared according to conventional techniques on a silicon structure. In the practice of the present invention, the silicon on insulator structure had an oxide layer approximately 5200 angstroms thick on the silicon structure, and a silicon film approximately 1200 angstroms thick on the oxide layer. The silicon film was subjected to a hydrofluoric acid (10% by volume) wet etch for about one minute. Next, the silicon on insulator structure was spun dry in an $N_2$ environment at approximately 50° C. Next the structure was inserted into a low pressure silicon chemical vapor deposition chamber and heated to 600° C. At 600° C. and at about 200 millitorr, the low pressure silicon chemical vapor deposition process was begun. After approximately 40 minutes, a layer of amorphous silicon approximately 2000 angstroms thick had been formed on the silicon film. Next, the silicon on insulator structure having formed thereon a layer of amorphous silicon, was loaded into an annealing furnace and maintained at 1275° C. with an atmosphere of 99.75% $N_2$ and 0.25% $O_2$ for one hour. After annealing, the device was allowed to cool and was inspected. The inspection showed that a single crystalline silicon layer was formed of an approximate depth of 3200 angstroms which corresponds to the depth of the silicon film, 1200 angstroms, and depth of the layer of formerly amorphous silicon 2000 angstroms.

It should be noted that the present invention can also be applied in instances for use in conjunction with conventional silicon epitaxial formation processes. For example, processes of the present invention could be used for form a layer of single crystalline silicon on a silicon on insulator device which is thicker than the relatively thin single crystalline film formed during formation of the silicon on insulator device. Subsequently, this thicker layer of single crystalline silicon could be used as a starting point for formation of an even thicker single crystalline layer of silicon formed by conventional techniques for epitaxially forming single crystal silicon.

While a preferred embodiment of the present invention and its advantages have been set out in the above detailed description, the invention is not limited thereto, but only by the spirit and scope of the appended claims

What is claimed is:

1. A method of forming an epitaxial silicon layer on a single crystalline silicon film which is on an insulating layer, said method comprising:
    implanting oxygen into the surface of a silicon material;
    annealing the silicon material so that a single crystalline film is formed over a layer of silicon dioxide;
    forming a layer of amorphous silicon on said single crystalline silicon film; and
    annealing all of said layer of amorphous silicon at substantially the same time to form a layer of single crystalline silicon.

2. The method of claim 1, wherein said layer of amorphous silicon is formed by low pressure chemical vapor deposition of silicon.

3. The method of claim 1, wherein said layer of amorphous silicon is formed by a molecular beam deposition process.

4. The method of claim 2, wherein said low pressure chemical vapor deposition process is carried out at a pressure of less than 250 millitorrs.

5. The method of claim 2, wherein said low pressure chemical vapor deposition process is carried out at less than 650° C.

6. The method of claim 1, further comprising, prior to said step of forming a layer of amorphous silicon on said silicon film, the step of:
    treating said silicon film to remove residual oxide from said silicon film.

7. The method of claim 6, wherein said step of treating said silicon film comprises:
    subjecting said film to a hydrofluoric acid wet etch.

8. The method of claim 6, wherein said step of treating said silicon film comprises:
    heating said silicon film.

9. The method of claim 8, wherein said heating of said silicon film is to temperatures below 725° C.

10. The method of claim 6, wherein said step of treating said silicon film comprises:
   subjecting said silicon film to a reduced pressure environment.

11. The method of claim 10, wherein said reduced pressure environment comprises a pressure of less than $10^{-5}$ torr.

12. The method of claim 6, wherein said step of annealing said layer of amorphous silicon comprises heating said layer of amorphous silicon to a temperature above 1000° C.

13. The method of claim 6, wherein said step of annealing said layer of amorphous silicon comprises heating said layer of amorphous silicon to a temperature above 1200° C.

14. The method of claim 6, wherein said step of treating said silicon film comprises:
   subjecting said silicon film to an environment of from 550° C. to 700° C. at a pressure of less than $10^{-7}$ torr.

* * * * *